US010020355B2

(12) United States Patent
Ito

(10) Patent No.: US 10,020,355 B2
(45) Date of Patent: Jul. 10, 2018

(54) PHOTOSENSOR AND DISPLAY DEVICE HAVING THE SAME

(71) Applicant: Japan Display Inc., Tokyo (JP)

(72) Inventor: Ryoichi Ito, Tokyo (JP)

(73) Assignee: Japan Display Inc., Tokyo (JP)

( * ) Notice: Subject to any disclaimer, the term of this patent is extended or adjusted under 35 U.S.C. 154(b) by 12 days.

(21) Appl. No.: 15/475,572

(22) Filed: Mar. 31, 2017

(65) Prior Publication Data

US 2017/0288001 A1  Oct. 5, 2017

(30) Foreign Application Priority Data

Apr. 4, 2016 (JP) ................................ 2016-074912

(51) Int. Cl.
| | | |
|---|---|---|
| *H01L 27/32* | (2006.01) | |
| *H01L 27/30* | (2006.01) | |
| *H01L 51/52* | (2006.01) | |
| *H01L 51/44* | (2006.01) | |

(52) U.S. Cl.
CPC ........ *H01L 27/3272* (2013.01); *H01L 27/307* (2013.01); *H01L 27/3225* (2013.01); *H01L 27/3246* (2013.01); *H01L 27/3262* (2013.01); *H01L 51/447* (2013.01); *H01L 51/5203* (2013.01); *H01L 51/5275* (2013.01)

(58) Field of Classification Search
CPC ............. H01L 31/1804; H01L 27/3272; H01L 51/5275; H01L 27/3262; H01L 27/307
See application file for complete search history.

(56) References Cited

U.S. PATENT DOCUMENTS

| | | | | |
|---|---|---|---|---|
| 2005/0029521 A1* | 2/2005 | Yamasaki | ......... | G02F 1/136213 257/72 |
| 2011/0148835 A1* | 6/2011 | Yamazaki | ........... | G02F 1/13318 345/207 |
| 2011/0316427 A1* | 12/2011 | Okajima | ................. | G06F 3/042 315/151 |

FOREIGN PATENT DOCUMENTS

JP  2012-252359 A  12/2012

\* cited by examiner

*Primary Examiner* — Olik Chaudhuri
*Assistant Examiner* — Changhyun Yi
(74) *Attorney, Agent, or Firm* — Typha IP LLC

(57) ABSTRACT

A photosensor includes a first light-shielding layer provided on an insulating surface; a first insulating layer covering the first light-shielding layer; a semiconductor layer provided on the first insulating layer, the semiconductor layer being connected to a first electrode and a second electrode, and the semiconductor layer configuring a diode; a second insulating layer covering the semiconductor layer; an opening provided in the second insulating layer so as to surround the semiconductor layer as viewed from a planar direction and the opening reaching at least the first insulating layer; and a second light-shielding layer covering at least a side wall of the opening.

16 Claims, 13 Drawing Sheets

PHOTOSENSOR AND DISPLAY DEVICE HAVING THE SAME

CROSS REFERENCE TO RELATED APPLICATIONS

This application is based on and claims the benefit of priority from the prior Japanese Patent Application No. 2016-074912, filed on Apr. 4, 2016, the entire contents of which are incorporated herein by reference.

FIELD

The present invention relates to a photosensor and a display device having the photosensor.

BACKGROUND

Conventionally, as display devices, a liquid-crystal display (LCD) having liquid-crystal cells with a liquid-crystal layer retained between paired substrates and an organic electroluminescence display device which uses an organic electroluminescence material as a light-emitting element (organic electroluminescence element) of a display part have been known. For example, as described in Japanese Patent Application Laid-Open No. 2012-252359, a display device of any of the above includes an optical sensor such as a photodiode, and can thereby adjust the luminance of an image to be display in accordance with peripheral illuminance.

SUMMARY

A photosensor in one embodiment of the present invention includes a first light-shielding layer provided on an insulating surface; a first insulating layer which covers the first light-shielding layer; a semiconductor layer provided on the first insulating layer, the semiconductor layer being connected to a first electrode and a second electrode, and the semiconductor layer configuring a diode; a second insulating layer covering the semiconductor layer; an opening provided in the second insulating layer so as to surround the semiconductor layer as viewed from a planar direction and the opening reaching at least the first insulating layer; and a second light-shielding layer covering at least a side wall of the opening.

A display device in one embodiment of the present invention comprises; a photosensor; a transistor; a planarizing layer; and a light-emitting element, wherein the photosensor comprises: a first light-shielding layer provided on an insulating surface; a first insulating layer covering the first light-shielding layer; a semiconductor layer provided on the first insulating layer, the semiconductor layer being connected to a first electrode and a second electrode, and the semiconductor layer configuring a diode; a second insulating layer covering the semiconductor layer; an opening provided in the second insulating layer so as to surround the semiconductor layer as viewed from a planar direction and the opening reaching at least the first insulating layer; and a second light-shielding layer filling the opening, the transistor comprises another semiconductor layer of the same layer as the semiconductor layer, the light-emitting element is provided on the planarizing layer and electrically connected to the transistor, the planarizing layer is provided on the second light-shielding layer, and at least one of a gate electrode, a source electrode, and a drain electrode of the transistor is provided to the same layer as the first light-shielding layer or the second light-shielding layer.

DESCRIPTION OF EMBODIMENTS

Figure 1A:
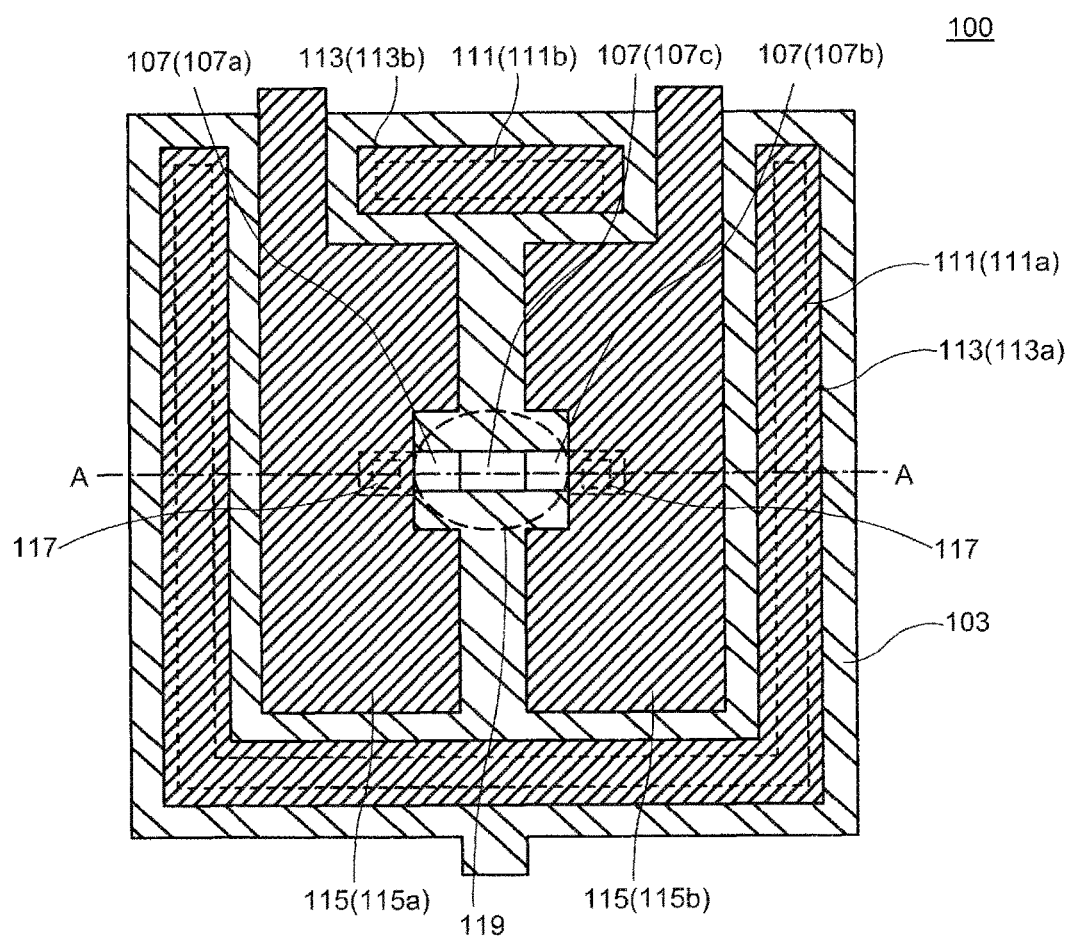
FIG. 1A is a plan view of a photosensor according to one embodiment of the present invention.

Unlike the liquid-crystal display device and so forth, the organic electroluminescence display device is a so-called self-luminous-type display device achieving display by causing an organic electroluminescence material (EL material) to emit light, having a wide viewing angle and being excellent in viewability. However, in the organic electroluminescence display device, light emitted from a light-emitting layer included in an electroluminescence layer (EL layer) propagates not only in a front direction on a display panel side, which is an observation side, but also in a lateral direction. Thus, when an optical sensor for detecting external light illuminance of a surrounding area is arranged on the same substrate of the EL layer including the light-emitting layer, light emitted from the light-emitting layer may be detected by the optical sensor, and therefore external light illuminance cannot be correctly measured. Moreover, there is a problem in which light emitted from the EL layer may saturate light-receiving sensitivity of the optical sensor.

One object of the present invention is to provide a photosensor capable of accurately detecting external light illuminance.

Another object of the present invention is to provide a display device including a photosensor capable of accurately detecting external light illuminance.

In the following, each embodiment of the present invention is described with reference to the drawings. However, the present invention can be implemented in various modes in a range not deviating from the gist of the present invention, and should not be interpreted as being restricted to the contents of the description of the embodiments exemplarily described below. Also, in the drawings, for more clarification of description, the width, thickness, shape, and others of each component may be schematically represented compared with actual modes. However, each of these schematic drawings is merely an example, and does not restrict interpretation of the present invention. Furthermore, in the specification and each drawing, a component identical to or similar to one described in a previously-described drawing is provided with the same reference character, and description of this component may be omitted.

In the present invention, when one film is processed to form a plurality of films, each of the plurality of these films may have different functions and roles. However, the plurality of these films are derived from a film formed in the same process and as the same layer, and have the same layer structure and the same material. Therefore, the plurality of these films are defined as being present on the same layer.

Note in the specification that representations such as "on", "above", "under" and "below" when drawings are described represent a relative positional relation between a structure of interest and another structure. In the specification, in a side view, a direction from an insulating surface to a semiconductor layer, which will be described further below, is defined as "upper", and a direction opposite thereto is defined as "lower". In the specification and claims, when a mode represented as "a structure is arranged on another structure" includes both of a case in which a structure is directly arranged on another structure so as to be in contact with another structure and a case in which a structure is arranged on another structure via still another structure, unless otherwise specified.

Also, in the specification, a "display device" refers to a device which displays an image by using a liquid-crystal layer or a light-emitting element such as an organic electroluminescence element. Therefore, the display device includes a display module (also referred to as a display panel) including a liquid-crystal layer or a light-emitting element such as an organic electroluminescence element and a display device having the display module in combination with another component (for example, a cover glass).

(First Embodiment)

Figure 1B:
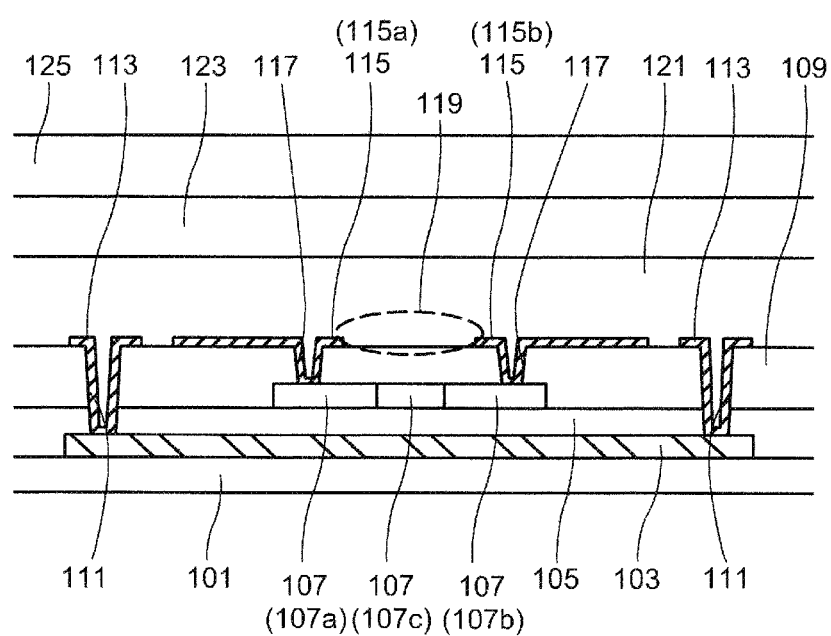
FIG. 1B is a cross-sectional view along an A-A line in FIG. 1A.

A schematic structure of a photosensor 100 of a first embodiment is described. FIG. 1A and FIG. 1B are diagrams showing the schematic structure of the photosensor 100 according to the first embodiment. FIG. 1A is a plan view of the photosensor 100 according to the first embodiment as viewed from above. FIG. 1B is a cross-sectional view along an A-A line in FIG. 1A. Note in FIG. 1A that some components are omitted for more clarification.

The photosensor 100 includes a first light-shielding layer 103 provided on an insulating surface, a first insulating layer 105 provided on the first light-shielding layer 103 to cover the first light-shielding layer 103, a semiconductor layer 107 provided on the first insulating layer 105, a second insulating layer 109 provided on the semiconductor layer 107 to cover the semiconductor layer 107, an opening 111 provided in the second insulating layer 109 so as to surround the semiconductor layer 107 as viewed from a planar direction and reaching at least the first insulating layer 105, a second light-shielding layer 113 which covers at least a side wall of the opening 111, and an electrode layer 115 provided to the same layer as the second light-shielding layer 113 and electrically connected to the semiconductor layer 107. Note that the photosensor 100 may include another component in addition to the above-described components.

Specifically, the insulating surface on which the first light-shielding layer 103 is provided is a surface of an insulating material 101. The insulating material 101 supports each of the first light-shielding layer 103, the semiconductor layer 107, and others provided above that surface. The material of the insulating material 101 is not particularly restricted as long as it is an insulating substance. The insulating material 101 may be an insulating layer or an insulating substrate.

The photosensor 100 includes the first light-shielding layer 103 provided on the insulating material 101. The first light-shielding layer 103 shields light from a lateral direction, for example, light transmitted through the film of the first insulating layer 105. The first light-shielding layer 103 comprises a light-shielding material. The first light-shielding layer 103 may be a metal layer. When the first light-shielding layer 103 is a metal layer, the first light-shielding layer 103 may be applied with a control potential having a predetermined potential difference with respect to a P-type impurity region 107a or an N-type impurity region 107b of the semiconductor layer 107, which will be described further below. The control potential to be applied to the first light-shielding layer 103 may be equal to a potential to be applied to the P-type impurity region 107a or the N-type impurity region 107b.

The first insulating layer 105 is provided on the first light-shielding layer 103 to cover the first light-shielding layer 103. The first insulating layer 105 comprises an inorganic insulating material. As the inorganic insulating material, for example, silicon oxide, silicon nitride, nitrided silicon oxide, oxidized silicon nitride, or the like may be used.

The semiconductor layer 107 is provided on the first insulating layer 105. The semiconductor layer 107 contains polysilicon. Polysilicon may be low-temperature polysilicon generated by annealing amorphous silicon at approximately 500° C. The semiconductor layer 107 includes the P-type impurity region 107a, the N-type impurity region 107b, and an intrinsic region 107c provided between the P-type impurity region 107a and the N-type impurity region 107b. The P-type impurity region 107a is doped with impurities such as boron or aluminum providing P-type conductivity to the semiconductor layer 107. The N-type impurity region 107b is doped with impurities such as phosphorus, arsenic, or nitrogen providing N-type conductivity to the semiconductor layer 107. The semiconductor layer 107 configures a diode, and a first electrode and a second electrode, which will be described further below, are connected to the P-type impurity region 107a and the N-type impurity region 107b, respectively.

The second insulating layer 109 is provided on the semiconductor layer 107 to cover the semiconductor layer 107. The second insulating layer 109 contains an inorganic insulating material. As the inorganic insulating material, for example, silicon oxide, silicon nitride, nitrided silicon oxide, oxidized silicon nitride, or the like may be used.

The opening 111 is provided in the second insulating layer 109. The opening 111 reaches at least the first insulating layer 105. Also, as shown in FIG. 1B, the opening 111 may be provided in the second insulating layer 109 and the first insulating layer 105, and a bottom part of the opening 111 may be exposed to the first light-shielding layer 103. As shown in FIG. 1A, the opening 111 is provided so as to surround the semiconductor layer 107 as viewed from a planar direction. Here, the "planar direction" refers to a direction in which the photosensor 100 is viewed from the direction perpendicular to the insulating surface. In the present embodiment, the opening 111 includes a continuous portion 111a surrounding three sides around the semiconductor layer 107 and an island-shaped portion 111b separated from the continuous portion 111a.

The second light-shielding layer 113 covers at least the side wall of the opening 111. Although not shown, the second light-shielding layer 113 may fill the opening 111. The second light-shielding layer 113 is provided so as to surround the semiconductor layer 107 as viewed from the planar direction, and shields light from a lateral direction, for example, light transmitted through the first insulating layer 105 and the second insulating layer 109. As shown in FIG. 1A, in the present embodiment, the second light-shielding layer 113 includes a continuous portion 113a surrounding three sides around the semiconductor layer 107 and an island-shaped portion 113b separated from the continuous portion 113a. A space between the continuous portion 113a and the island-shaped portion 113b is used to draw the electrode layer 115, which will be described further below. As viewed from a cross-sectional direction, a lower surface of the second light-shielding layer 113 in the opening 111 is preferably closer to the insulating surface, that is, the surface of the insulating material 101, rather than a lower surface of the semiconductor layer 107. As shown in FIG. 1B, when the bottom part of the opening 111 exposes the first light-shielding layer 103, the second light-shielding layer 113 covering at least the side wall of the opening 111 and the first light-shielding layer 103 may make contact with each other.

The second light-shielding layer 113 contains a light-shielding material. The second light-shielding layer 113 may be a metal layer. Here, when the first light-shielding layer 103 and the second light-shielding layer 113 are both metal layers and a control potential is applied to the first light-shielding layer 103, the second light-shielding layer 113 and the first light-shielding layer 103 are electrically connected to each other. And then, the second light-shielding layer 113 has a potential equal to the potential of the first light-shielding layer 103.

The electrode layer 115 is provided to the same layer as the second light-shielding layer 113, and is arranged a predetermined distance away from the second light-shielding layer 113. The electrode layer 115 is electrically connected to the semiconductor layer 107. More specifically, the electrode layer 115 covers at least a side wall of a contact hole 117 provided in the second insulating layer 109. Although not shown, the electrode layer 115 may fill the contact hole 117. The contact hole 117 reaches the semiconductor layer 107, and the P-type impurity region 107a and the N-type impurity region 107b of the semiconductor layer 107 are exposed to a bottom part of the contact hole 117. The electrode layer 115 includes a first electrode 115a electrically connected to the P-type impurity region 107a of the semiconductor layer 107 and a second electrode 115b electrically connected to the N-type impurity region 107b of the semiconductor layer 107. To each of the first electrode 115a and the second electrode 115b, a potential having a predetermined potential difference is applied from an external power supply or the like not shown. The potential to be applied to the first electrode 115a or the second electrode 115b may be equal to the control potential to be applied to the first light-shielding layer 103. The electrode layer 115 contains metal, and may be configured of the same material as that of the second light-shielding layer 113 when the second light-shielding layer 113 is a metal layer.

The electrode layer 115 is arranged so that a light-receiving region 119 is formed above the semiconductor layer 107. The light-receiving region 119 overlaps at least a part of the semiconductor layer 107. As shown in FIG. 1A and FIG. 1B, the light-receiving region 119 may overlap at least the intrinsic region 107c of the semiconductor layer 107. Also, although not shown, the light-receiving region 119 may overlap at least the P-type impurity region 107a or the N-type impurity region 107b of the semiconductor layer 107.

The photosensor 100 may include a planarizing layer 121 provided on the second light-shielding layer 113 and above the electrode layer 115. The planarizing layer 121 has a function of absorbing asperities caused by the electrode layer 115, the second light-shielding layer 113, and so forth provided therebelow to provide a planarized surface. The planarizing layer 121 contains an organic insulating material. As the organic insulating material, examples include epoxy resin, acrylic resin, and high-polymer materials such as polyimide, polyamide, polycarbonate, and polysiloxane. Also, the planarizing layer 121 may contain an inorganic insulating material for use in the first insulating layer 105 or the second insulating layer 109.

Also, the photosensor 100 may include a resin film 123 provided on the planarizing layer 121. The resin film 123 contains an organic insulating material. As the organic insulating material, examples include epoxy resin and acrylic resin. Above the resin film 123, a sealing film 125 may be provided. The sealing film 125 has a function of preventing external moisture from entering a light-emitting element including a light-emitting layer not shown, and a material with high gas barrier capability is preferably used. As a material for use in the sealing film 125, for example, an inorganic material such as silicon nitride, silicon oxide, nitrided silicon oxide, or oxidized silicon nitride may be used, or an organic material including acrylic resin, polysiloxane, polyimide, and polyester may be used. Note that the above-described planarizing layer 121 and the resin film 123 may be omitted.

As described above, in the photosensor 100 according to the present embodiment, the first light-shielding layer 103 is provided below the semiconductor layer 107, and the second light-shielding layer 113 is provided so as to surround the semiconductor layer 107. The first light-shielding layer 103 and the second light-shielding layer 113 shield light from the lateral direction, for example, light transmitted through the first insulating layer 105 and the second insulating layer 109. That is, the first light-shielding layer 103 and the second light-shielding layer 113 prevent light other than external light from entering the semiconductor layer 107. The semiconductor layer 107 receives external light mainly via the light-receiving region 119. Thus, the photosensor 100 can improve detection accuracy of external light illuminance.

Also, when the first light-shielding layer 103 of the photosensor 100 is a metal layer, external light entering from a region between the second light-shielding layer 113 and the electrode layer 115 can be reflected toward the semiconductor layer 107. Thus, the photosensor 100 can further improve detection accuracy of external light illuminance.

Furthermore, the first light-shielding layer 103 of the photosensor 100 is a metal layer and, when a control potential is applied, the intrinsic region 107c is biased to improve photosensitivity of the photosensor 100. Thus, detection accuracy of external light illuminance can be further improved. Still further, the response speed of the photosensor 100 can be improved.

(Second Embodiment)

Figure 2A:
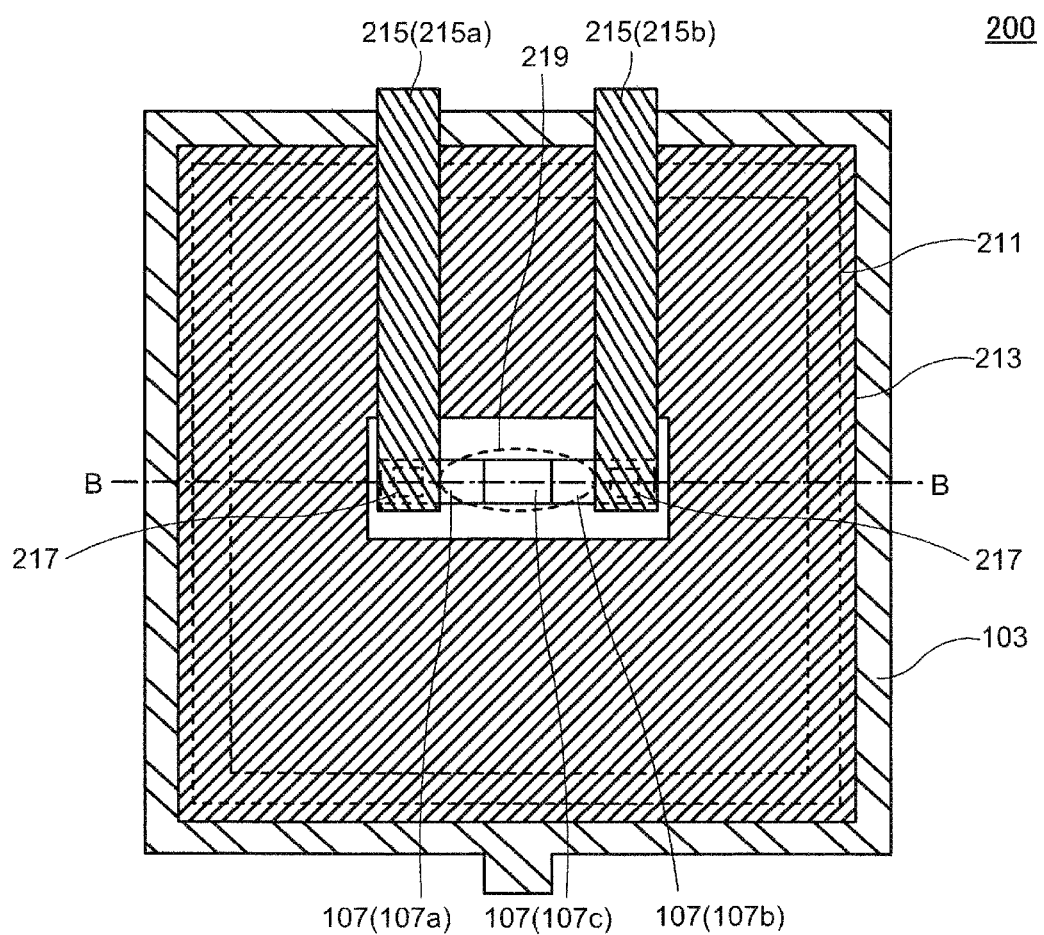
FIG. 2A is a plan view of a photosensor according to one embodiment of the present invention.
Figure 2B:
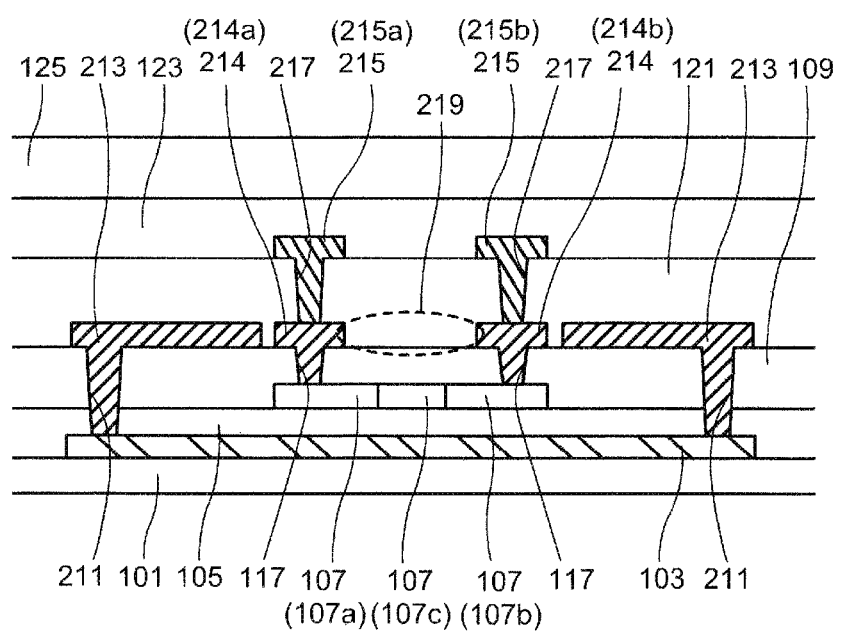
FIG. 2B is a cross-sectional view along a B-B line in FIG. 2A.

Next, a schematic structure of a photosensor 200 of a second embodiment is described. FIG. 2A and FIG. 2B are diagrams showing the schematic structure of the photosensor 200 according to the second embodiment. FIG. 2A is a plan view of the photosensor 200 according to the second embodiment as viewed from above. FIG. 2B is a cross-sectional view along a B-B line in FIG. 2A. In FIG. 2A, some components are omitted for more clarification. Note in FIG. 2A and FIG. 2B that a component identical or similar to the structure of the photosensor 100 shown in FIG. 1A and FIG. 1B is provided with the same reference character and redundant description is omitted.

The photosensor 200 includes the insulating material 101, the first light-shielding layer 103 provided on the surface of the insulating material 101, the first insulating layer 105 provided on the first light-shielding layer 103 to cover the first light-shielding layer 103, the semiconductor layer 107 provided on the first insulating layer 105, the second insulating layer 109 provided on the semiconductor layer 107 to cover the semiconductor layer 107, an opening 211 provided in the second insulating layer 109 so as to surround the semiconductor layer 107 as viewed from the planar direction and reaching at least the first insulating layer 105, a second light-shielding layer 213 which covers at least a side wall of the opening 211, a terminal 214 provided to the same layer as the second light-shielding layer 213 and electrically connected to the semiconductor layer 107, the planarizing layer 121 provided on the second light-shielding layer 213 and the terminal 214, and an electrode layer 215 provided on the planarizing layer 121 and electrically connected to the terminal 214. The photosensor 200 may include another component in addition to the above-described components. Note that the resin film 123 in the photosensor 200 may be omitted.

The photosensor 200 has a structure substantially similar to that of the photosensor 100 of the first embodiment except for the arrangement of the opening 211 and the second light-shielding layer 213 and that the electrode layer 215 electrically connected to the semiconductor layer 107 is arranged to a layer different from the second light-shielding layer 213. In the following, different points in the photosensor 200 from the above-described photosensor 100 are mainly described, and description of identical or similar points are omitted.

In the photosensor 200, the opening 211 is provided in the second insulating layer 109. The opening 211 reaches at least the first insulating layer 105. Also, as shown in FIG. 2B, the opening 211 may be provided in the second insulating layer 109 and the first insulating layer 105 and the first light-shielding layer 103 may be exposed to a bottom part of the opening 211. The opening 211 is provided so as to surround the semiconductor layer 107 as viewed from the planar direction. As shown in FIG. 2A, in the present embodiment, the opening 211 is provided so as to surround the entire periphery of the semiconductor layer 107 as viewed from the planar direction.

The second light-shielding layer 213 covers at least a side wall of the opening 211. As shown, the second light-shielding layer 213 may fill the opening 211. The second light-shielding layer 213 is provided so as to surround the semiconductor layer 107 as viewed from the planar direction, and shields light from the lateral direction, for example, light transmitted through the first insulating layer 105 and the second insulating layer 109. As shown in FIG. 2A, in the present embodiment, the second light-shielding layer 213 is provided so as to surround the entire periphery of the semiconductor layer 107 as viewed from the planar direction. As viewed from a cross-sectional direction, a lower surface of the second light-shielding layer 213 in the opening 211 is preferably closer to the surface of the insulating material 101 rather than a lower surface of the semiconductor layer 107. As shown in FIG. 2B, when the bottom part of the opening 211 exposes the first light-shielding layer 103, the second light-shielding layer 213 covering at least the side wall of the opening 211 and the first light-shielding layer 103 may make contact with each other.

As with the second light-shielding layer 113 in the photosensor 100, the second light-shielding layer 213 contains a light-shielding material. The second light-shielding layer 213 may be a metal layer. Here, when the first light-shielding layer 103 and the second light-shielding layer 213 are both metal layers and a control potential is applied to the first light-shielding layer 103, the second light-shielding layer 213 and the first light-shielding layer 103 are electrically connected to each other, and the second light-shielding layer 213 has a potential equal to the potential of the first light-shielding layer 103.

The terminal 214 is provided to the same layer as the second light-shielding layer 213, and is arranged a predetermined distance away from the second light-shielding layer 213. The terminal 214 makes contact with the semiconductor layer 107. More specifically, the terminal 214 covers at least the side wall of the contact hole 117 provided in the second insulating layer 109. As shown, the terminal 214 may fill the contact hole 117. The contact holes 117 reach the semiconductor layer 107, and the P-type impurity region 107a and the N-type impurity region 107b of the semiconductor layer 107 are exposed to the bottom part of the contact holes 117. The terminal 214 includes a terminal 214a in contact with the P-type impurity region 107a of the semiconductor layer 107 and a terminal 214b in contact with the N-type impurity region 107b of the semiconductor layer 107. The terminal 214 contains metal, and may be configured of the same material as that of the second light-shielding layer 213 when the second light-shielding layer 213 is a metal layer.

The terminal 214a and the terminal 214b are arranged so that a light-receiving region 219 is formed above the semiconductor layer 107. The light-receiving region 219 overlaps at least a part of the semiconductor layer 107. As shown in FIG. 2A and FIG. 2B, the light-receiving region 219 may overlap at least a part of the intrinsic region 107c of the semiconductor layer 107. Also, although not shown, the light-receiving region 219 may overlap at least a part of the P-type impurity region 107a or the N-type impurity region 107b of the semiconductor layer 107.

The planarizing layer 121 is provided on the second light-shielding layer 213 and on the terminal 214. The planarizing layer 121 has a function of absorbing asperities caused by the terminal 214 and the second light-shielding layer 113 provided therebelow to provide a planarized surface. The planarizing layer 121 is provided with via holes 217 to expose the terminal 214a and the terminal 214b.

The electrode layer 215 contains metal, and is provided on the planarizing layer 121. The electrode layer 215 is arranged so that the light-receiving region 219 is formed above the semiconductor layer 107. The electrode layer 215 may be provided so as to overlap the terminal 214. The electrode layer 215 covers at least side walls of the via holes 217 provided in the planarizing layer 121 and is electrically connected to the terminal 214. As shown in FIG. 2B, the electrode layer 215 may fill the via holes 217. The electrode layer 215 includes a first electrode 215a electrically connected to the terminal 214a in contact with the P-type impurity region 107a of the semiconductor layer 107 and a second electrode 215b electrically connected to the terminal 214b in contact with the N-type impurity region 107b of the semiconductor layer 107. To each of the first electrode 215a and the second electrode 215b, a potential having a predetermined potential difference is applied from an external power supply or the like not shown. The potential to be applied to the first electrode 215a or the second electrode 215b may be equal to the control potential to be applied to the first light-shielding layer 103.

In the photosensor 200 according to the present embodiment, the first light-shielding layer 103 is provided below the semiconductor layer 107, and the electrode layer 215 is provided to a layer different from the second light-shielding layer 213. Therefore, the second light-shielding layer 213 is provided so as to surround the entire periphery of the semiconductor layer 107 as viewed from the planar direction. Thus, light other than external light can be effectively prevented from entering the semiconductor layer 107. Therefore, light-receiving sensitivity of the photosensor 200 with respect to external light illuminance is improved, and detection accuracy of external light illuminance by the photosensor 200 can be further improved.

(Third Embodiment)

Figure 3:
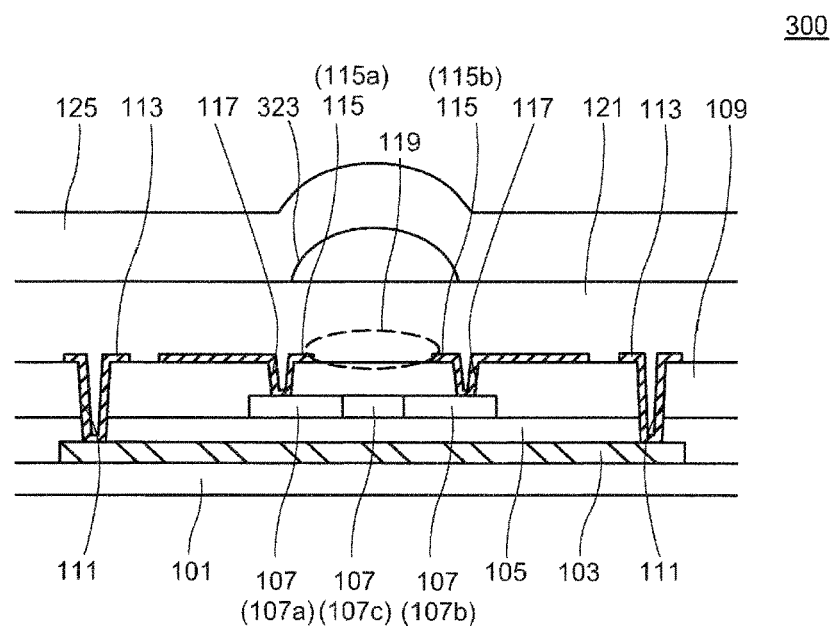
FIG. 3 is a cross-sectional view of a photosensor according to one embodiment of the present invention.

A schematic structure of a photosensor 300 of a third embodiment is described. FIG. 3 is a cross-sectional view showing the schematic structure of the photosensor 300 according to the third embodiment. In FIG. 3, a component identical or similar to the structure of the photosensor 100 shown in FIG. 1A and FIG. 1B is provided with the same reference character and redundant description is omitted.

As with the photosensor 100 according to the first embodiment, the photosensor 300 includes the insulating material 101, the first light-shielding layer 103 provided on the surface of the insulating material 101, the first insulating layer 105 provided on the first light-shielding layer 103 to cover the first light-shielding layer 103, the semiconductor layer 107 provided on the first insulating layer 105, the second insulating layer 109 provided on the semiconductor layer 107 to cover the semiconductor layer 107, the opening 111 provided in the second insulating layer 109 so as to surround the semiconductor layer 107 as viewed from the planar direction and reaching at least the first insulating layer 105, the second light-shielding layer 113 which covers at least the side wall of the opening 111, and the electrode layer 115 provided to the same layer as the second light-shielding layer 113 and electrically connected to the semiconductor layer 107. The photosensor 300 further includes the planarizing layer 121 provided on the second light-shielding layer 113 and a lens 323 provided on the planarizing layer 121. The photosensor 300 has a structure substantially the same as that of the photosensor 100 except that the lens 323 is provided.

The lens 323 is provided on the planarizing layer 121 so as to overlap the semiconductor layer 107 as viewed from the planar direction. The lens 323 contains acrylic resin. Also, the lens 323 may contain an organic insulating material other than acrylic resin, for example, epoxy resin. The lens 323 can be formed simultaneously with formation of a bank for partitioning light-emitting elements in a pixel region not shown, by using the same material as the material for forming the bank.

In the photosensor 300 according to the present embodiment, the lens 323 is provided on the planarizing layer 121 so as to overlap the semiconductor layer 107. With this, it is possible to condense external light to the light receiving region 119. Thus, light-receiving sensitivity of the photosensor 300 with respect to external light illuminance is improved, and detection accuracy of external light illuminance by the photosensor 300 can be further improved.

Any of the above-described photosensors according to the present invention can be applied to a display device such as an organic electroluminescence display device as a sensor for detecting and measuring external light illuminance. An example when the photosensor according to the present invention is used as a sensor applied to a display device is shown in FIG. 4.

Figure 4:
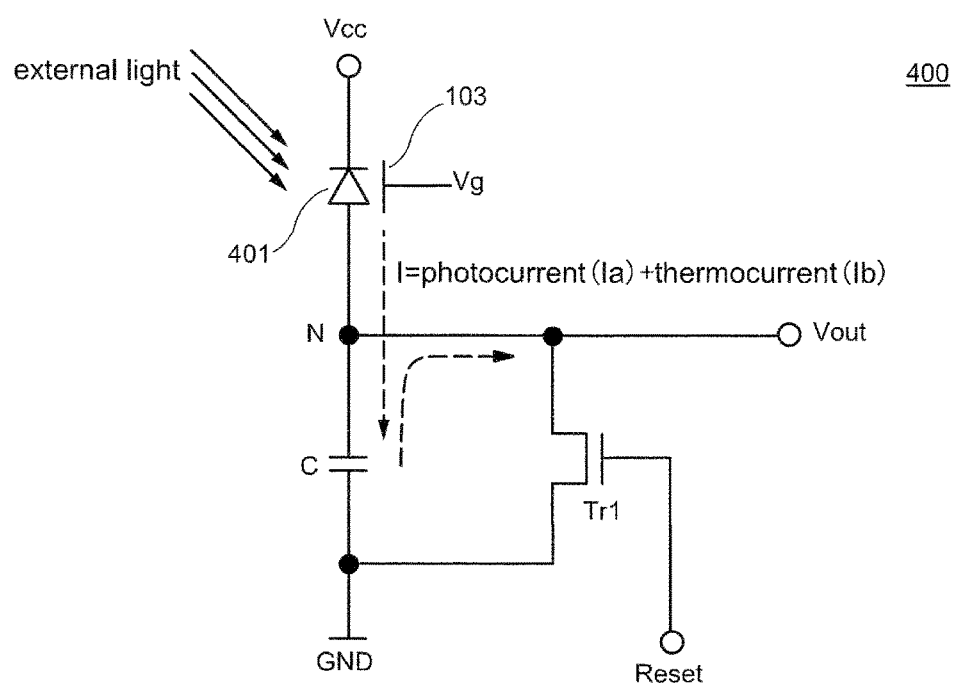
FIG. 4 is an equivalent circuit diagram showing one example of an optical detection circuit using the photosensor according to one embodiment of the present invention.

FIG. 4 is an equivalent circuit diagram showing a photo detection circuit 400 using the photosensor according to the present invention. As shown in FIG. 4, the photo detection circuit 400 includes a photosensor 401 according to the present invention, a capacitor C, and a reset transistor Tr1. The photosensor 401 may be any of the above-described photosensors 100, 200, and 300.

The reset transistor Tr1 has one end connected to a node N and the other end connected to a ground GND, and has a gate terminal connected to a rest signal line to which a reset signal Reset is applied. When the reset signal Reset becomes active (at a high level when the reset transistor Tr1 is an N-type transistor), the reset transistor Tr1 becomes in an ON state, and electric charge charged in the capacitor C is discharged to cause the potential of the node N to become at a ground level.

The capacitor C is connected between the node N and the ground GND. Also, the capacitor C is connected in series to the photosensor 401 via the node N. In the photo detection circuit 400, when external light enters the photosensor 401, the photosensor 401 outputs a current I in accordance with illuminance (light quantity) of incident light. The current I is output via the node N to the capacitor C to charge the capacitor C. When the capacitor C is charged, the potential of the node N increases, and the current I is output from an output terminal Vout.

Also, in FIG. 4, a state is shown in which the first light-shielding layer 103 of the photosensor 401 is applied with a control potential Vg. As described above, by applying the control potential Vg to the first light-shielding layer 103, photosensitivity of the photosensor 401 can be improved.

In the photo detection circuit 400, the current I flowing through the photosensor 401 is a sum of a photocurrent (Ia) varying in accordance with illuminance of light incident to the photosensor 401 and a thermocurrent (Ib) increasing with an exponential function of absolute temperature of the photosensor 401. Therefore, to enhance detection accuracy of external light illuminance, thermocurrent (Ib) components are preferably eliminated.

Figure 5:
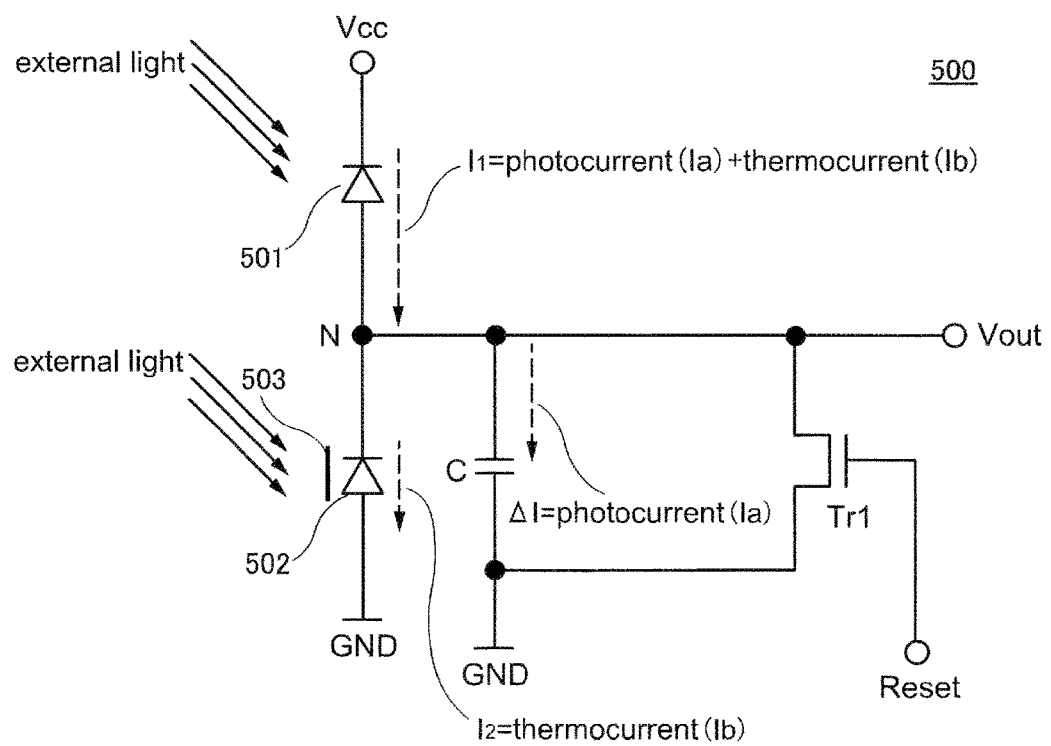
FIG. 5 is an equivalent circuit diagram showing another example of the optical detection circuit using the photosensor according to one embodiment of the present invention.

Another example of the photo detection circuit when the photosensor according to the present invention is used as a sensor to be applied to a display device is shown in FIG. 5. FIG. 5 is an equivalent circuit diagram showing a photo detection circuit 500 using the photosensor according to the present invention. As shown in FIG. 5, the photo detection circuit 500 includes a photosensor 501 according to the present invention, a heat sensor 502, a light-shielding film 503, a capacitor C, and a reset transistor Tr1. The photosensor 501 may be any of the above-described photosensors 100, 200, and 300.

The heat sensor 502 has a structure similar to that of the above-described photosensor 501 according to the present invention except that the semiconductor layer (the light-receiving region of the semiconductor layer) is covered with the light-shielding film 503. That is, the photosensor 501 and the heat sensor 502 have substantially the same photoelectric conversion characteristics. In the heat sensor 502, since the semiconductor layer is covered with the light-shielding film 503, external light does not enter the semiconductor layer. Thus, a current I2 flowing through the heat sensor 502 is a thermocurrent (Ib) increasing in an exponential function manner with respect to the absolute temperature of the heat sensor 502. The heat sensor 502 is connected in series to the photosensor 501 via the node N. Note that it is assumed that the heat sensor 502 is arranged near the photosensor 501 to the extent that a difference in light quantity of external light is allowable.

The light-shielding film 503 covers the semiconductor layer of the heat sensor 502 to shield external light so that external light does not enter the semiconductor layer in the heat sensor 502. The light-shielding film 503 is a light-shielding layer such as a metal layer and overlaps the semiconductor layer of the heat sensor 502. Also, as the light-shielding film 503, in the display device, a black matrix layer may be provided to an opposing substrate which opposes a substrate where the semiconductor layer of the heat sensor 502 is formed.

In the photo detection circuit 500, when external light enters the photosensor 501, the photosensor 501 outputs the current I in accordance with illuminance (light quantity) of incident light. Here, the current I1 flowing through the photosensor 501 is a sum of the photocurrent (Ia) varying in accordance with illuminance of light incident to the photosensor 501 and the thermocurrent (Ib) increasing in an exponential function manner with respect to the absolute temperature of the photosensor 501. On the other hand, the current I2 flowing through the heat sensor 502 is the thermocurrent (Ib). The photosensor 501 and the heat sensor 502 are connected to each other via the node N, and the capacitor C is connected between the node N and the ground GND. A current $\Delta I$ (=I1−I2) indicating a difference between the current I1 and the current I2 is output from the node N to the capacitor C. The current $\Delta I$ is output via the node N to the capacitor C to charge the capacitor C. When the capacitor C is charged, the potential of the node N increases, and the current $\Delta I$ is output from the output terminal Vout.

In this manner, in the photo detection circuit 500, since the photosensor 501 which outputs the current I1 in accordance with illuminance (light quantity) of external light and the heat sensor 502 which outputs the thermocurrent I2 (=Ib) are provided, thermocurrent (Ib) components can be eliminated. Therefore, detection accuracy of external light illuminance of the photo detection circuit 500 is further improved.

Although not shown in FIG. 5, as with the photosensor 401 shown in FIG. 4, photosensitivity of the photosensor 501 can be improved by applying the control potential to the first light-shielding layer 103 of the photosensor 501.

Figure 6A:
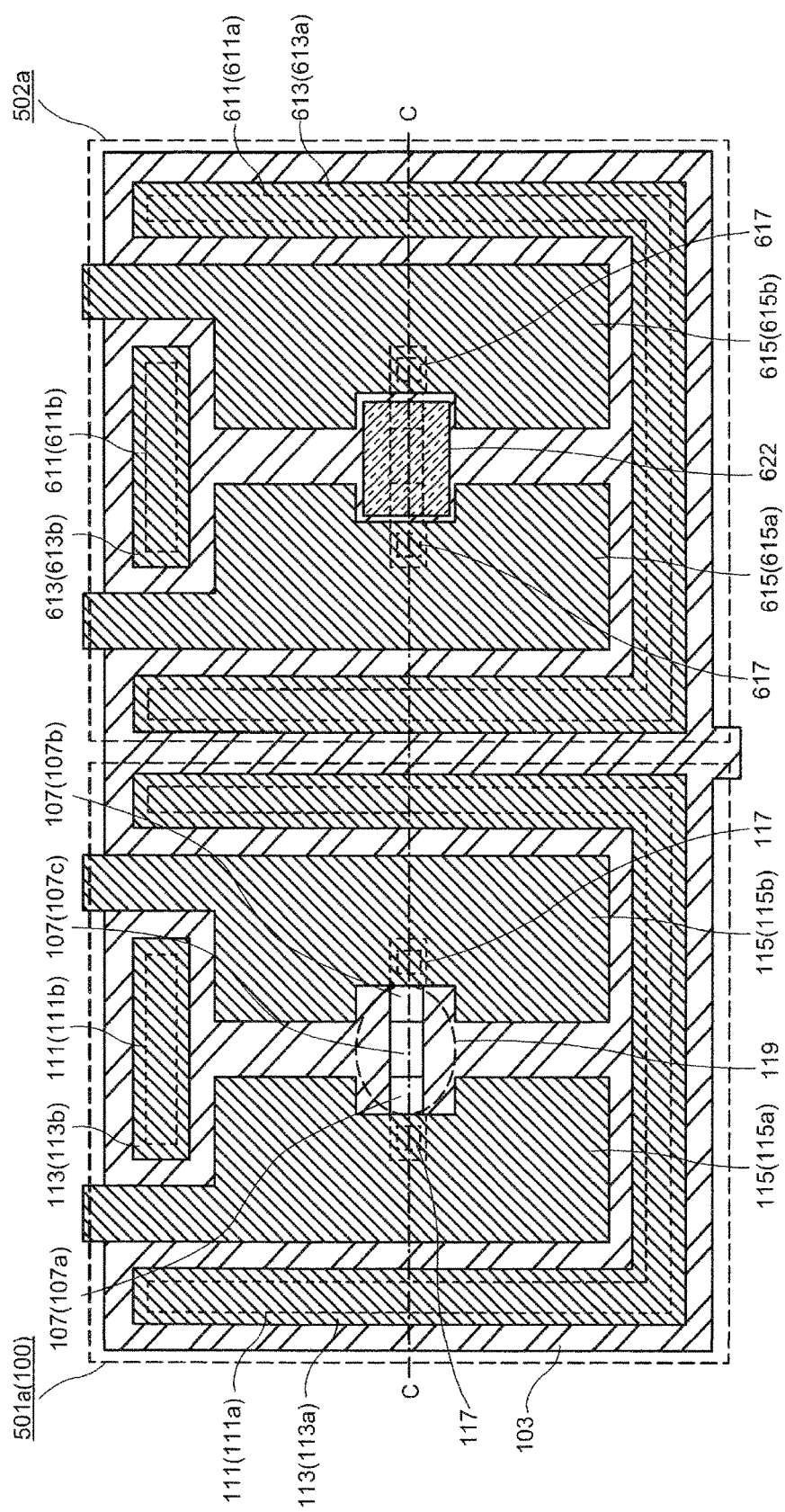
FIG. 6A is a plan view of the photosensor according to one embodiment of the present invention and a heat sensor.
Figure 6B:
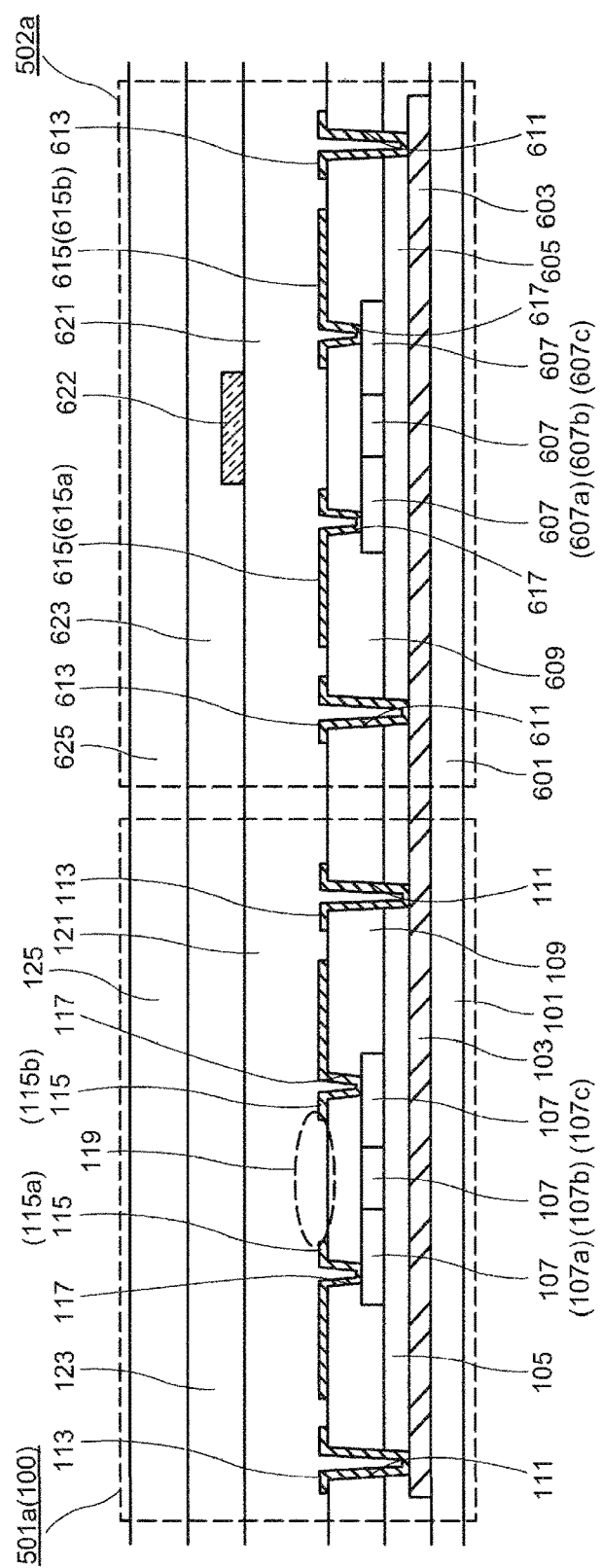
FIG. 6B is a cross-sectional view along a C-C line in FIG. 6A.

FIG. 6A and FIG. 6B are diagrams showing one example of a schematic structure of the photosensor 501 and the heat sensor 502 of the photo detection circuit 500 provided to the same layer. FIG. 6A is a plan view of a photosensor 501a and a heat sensor 502a as viewed from above. FIG. 6B is a cross-sectional view along a C-C line in FIG. 6A. In FIG. 6A, some components are omitted for more clarification. In FIG. 6A and FIG. 6B, the photosensor 501a has the same structure as that of the above-described photosensor 100 according to the first embodiment. Also, the heat sensor 502a is assumed to have substantially the same structure as that of the photosensor 501a except for a part of the components. Note in FIG. 6A and FIG. 6B that a component identical or similar to the structure of the photosensor 100 shown in FIG. 1A and FIG. 1B is provided with the same reference character and redundant description is omitted.

With reference to FIG. 6A and FIG. 6B, the heat sensor 502a has the same structure as that of the photosensor 501a except that a light-shielding film 622 is provided on a planarizing layer 621. The light-shielding film 622 is a metal layer provided so as to overlap at least a part of a semiconductor layer 607. The light-shielding film 622 may be provided so as to overlap at least a light-receiving region of the semiconductor layer 607.

Note that while the light-shielding film 622 is provided on the planarizing layer 621 in FIG. 6B, the light-shielding film 622 is not restricted to be arranged on the planarizing layer 621. For example, in the heat sensor 502a, the light-shielding film 622 may be provided to the same layer as a second light-shielding layer 613 and an electrode layer 615. In this case, the light-shielding film 622 may contain the same metal as that of the second light-shielding layer 613 and the electrode layer 615. When the light-shielding film 622 is provided to the same layer as the second light-shielding layer 613 and the electrode layer 615, the light-shielding film 622 is arranged a predetermined distance away from the electrode layer 615.

Figure 7A:
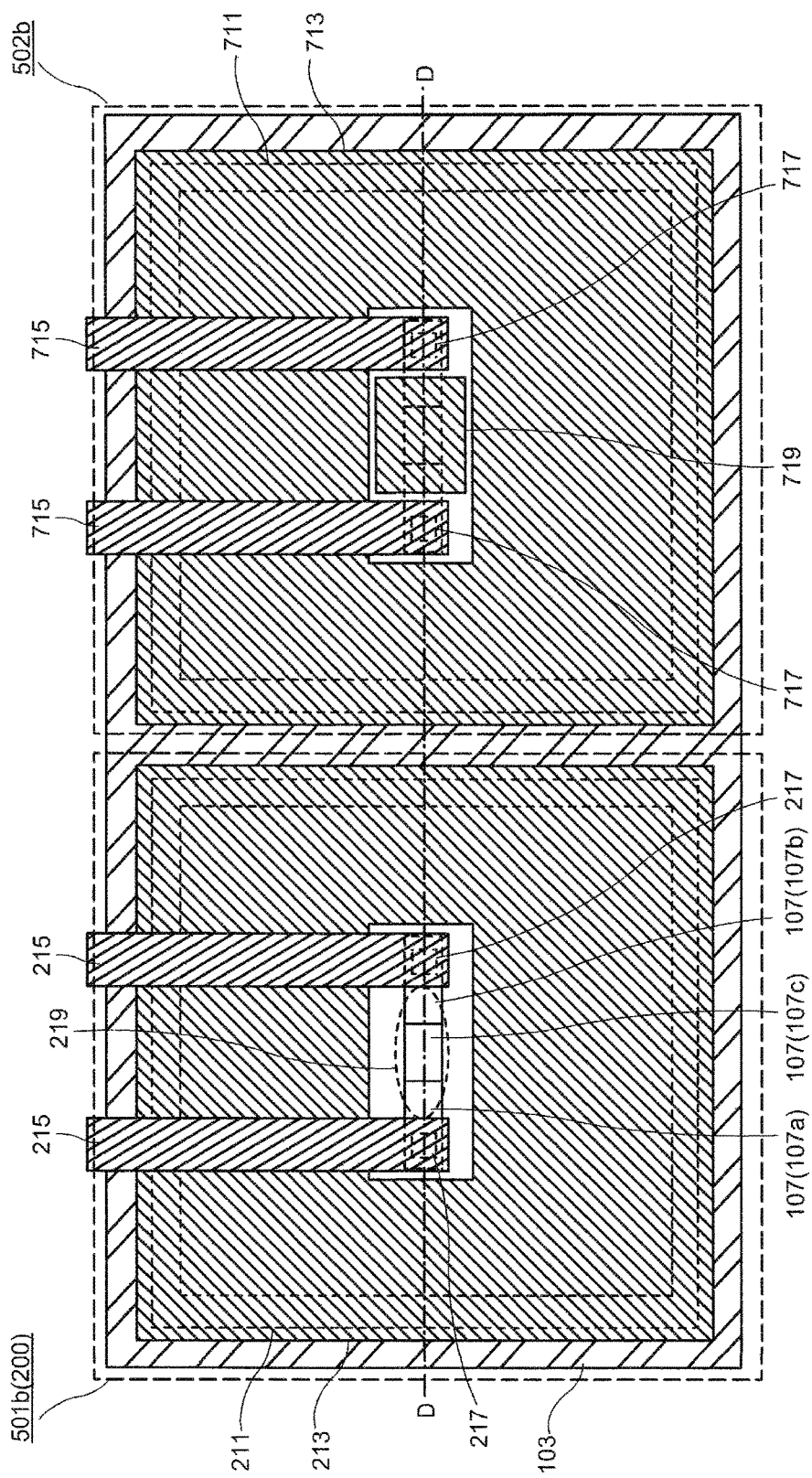
FIG. 7A is a plan view of the photosensor according to one embodiment of the present invention and a heat sensor.
Figure 7B:
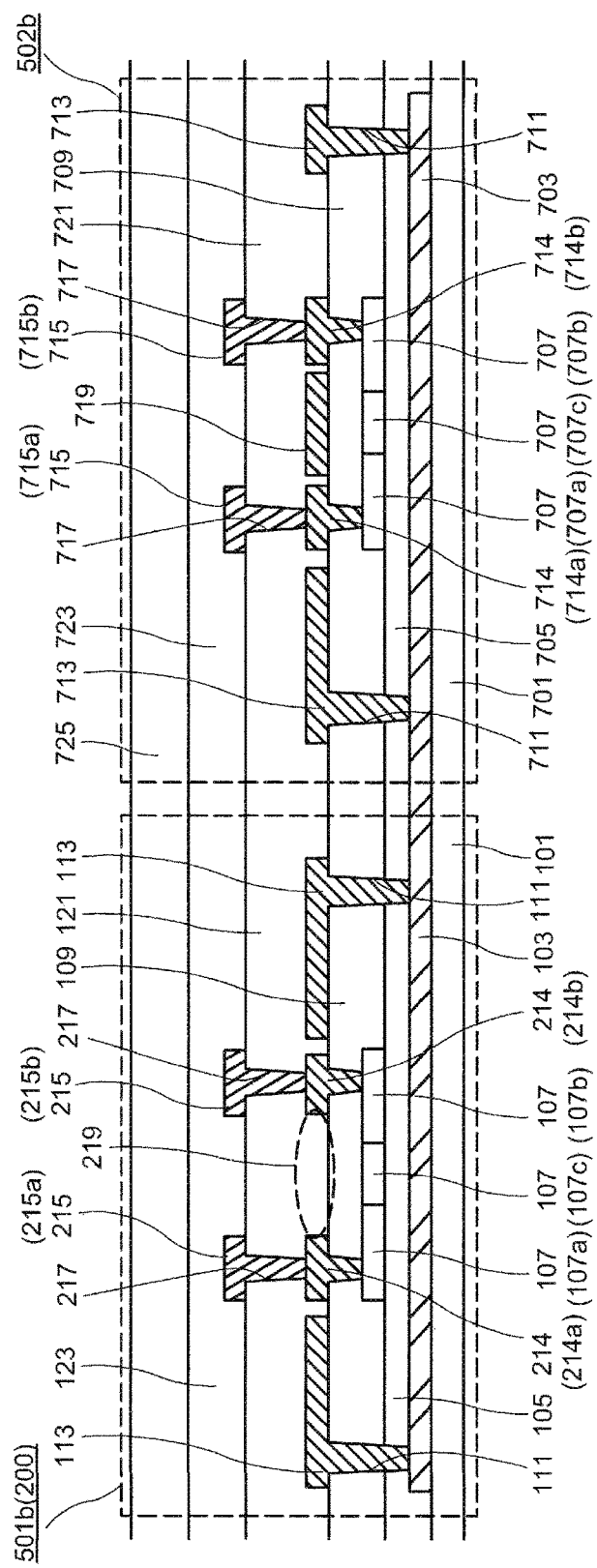
FIG. 7B is a cross-sectional view along a D-D line in FIG. 7A.

FIG. 7A and FIG. 7B are diagrams showing another example of the schematic structure of the photosensor 501 and the heat sensor 502 of the photo detection circuit 500 provided to the same layer. FIG. 7A is a plan view of a photosensor 501b and a heat sensor 502b as viewed from above. FIG. 7B is a cross-sectional view along a D-D line in FIG. 7A. In FIG. 7A, some components are omitted for more clarification. In FIG. 7A and FIG. 7B, the photosensor 501b has the same structure as that of the above-described photosensor 200 according to the second embodiment. Also, the heat sensor 502b is assumed to have substantially the same structure as that of the photosensor 501b except for a part of the components. Note in FIG. 7A and FIG. 7B that a component identical or similar to the structure of the photosensor 200 shown in FIG. 2A and FIG. 2B is provided with the same reference character and redundant description is omitted.

With reference to FIG. 7A and FIG. 7B, the heat sensor 502b has the same structure as that of the photosensor 501b except that a light-shielding film 719 is provided on a first insulating layer 709. The light-shielding film 719 is a metal layer provided so as to overlap at least a part of a semiconductor layer 707. The light-shielding film 719 may be provided so as to overlap at least a light-receiving region of the semiconductor layer 707. As shown in FIG. 7B, the light-shielding film 719 is provided to the same layer as a second light-shielding layer 713 and a terminal 714. In this case, the light-shielding film 719 may contain the same metal as that of the second light-shielding layer 713 and the terminal 714. The light-shielding film 719 is arranged a predetermined distance away from the terminal 714.

Note that the light-shielding film 719 is not restricted to be arranged above the first insulating layer 709, that is, the same layer as the second light-shielding layer 713 and the terminal 714. For example, in the heat sensor 502b, the light-shielding film 719 may be provided on a planarizing layer 721, that is, to the same layer as the electrode layer 715. In this case, the light-shielding film 719 may contain the same metal as that of the electrode layer 715. When the light-shielding film 719 is provided to the same layer as the electrode layer 715, the light-shielding film 719 is arranged a predetermined distance away from the electrode layer 715.

Although not shown, the second electrode 215b of the photosensor 501b and a second electrode 715b of the heat sensor 502b may be common to each other. In this case, the semiconductor layer 707 of the heat sensor 502b is provided so that an N-type impurity region 707b and a P-type impurity region 707a are positioned so as to be opposite to each other. Similarly, the first electrode 215a of the photosensor 501b and a first electrode 715a of the heat sensor 502b may be common to each other. In this case, the semiconductor layer 107 of the photosensor 501b is provided so that the P-type impurity region 107a and the N-type impurity region 107b are positioned so as to be opposite to each other.

In this manner, the photosensor 501 and the heat sensor 502 can be formed in the same process by providing the photosensor 501 and the heat sensor 502 to the same layer. As described above, in the heat sensor 502, the light-shielding film which covers the semiconductor layer may be provided to an opposing substrate which opposes a substrate where the semiconductor layer is formed.

(Fourth Embodiment)

The above-described photosensor according to the present invention can be implemented in a display device as a photosensor for accurately detecting and measuring external light illuminance. In the following, an example is described in which the photosensor according to the present invention is implemented in an organic electroluminescence display device as a display device.

Figure 8:
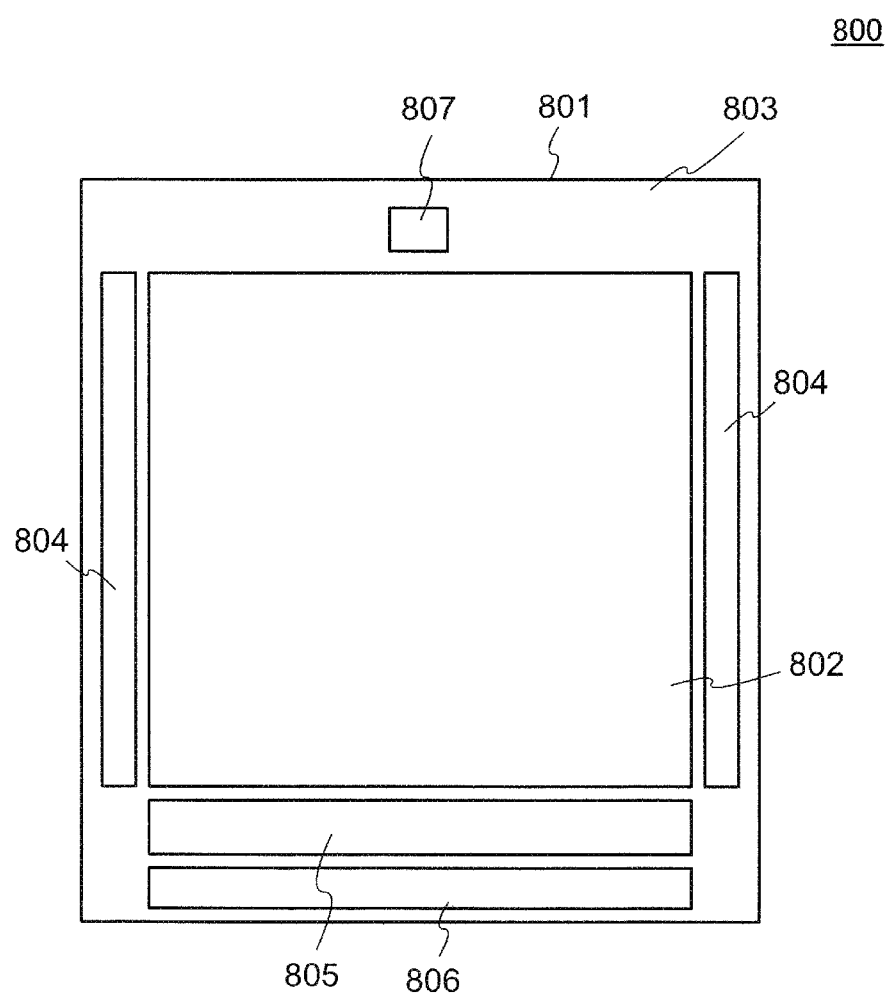
FIG. 8 is a schematic diagram showing the structure of an organic electroluminescence display device according to one embodiment of the present invention.

FIG. 8 is a schematic diagram showing the structure of an organic electroluminescence display device 800 equipped with the photosensor according to one embodiment of the present invention, showing a schematic structure of the organic electroluminescence display device 800 as viewed above from a planar direction. Here, the "planar direction" refers to a direction of the organic electroluminescence display device 800 viewed from a direction perpendicular to the screen (display area).

As shown in FIG. 8, the organic electroluminescence display device 800 includes a display region 802 formed on a substrate 801, a peripheral region 803 positioned on the periphery of the display region 802, a scanning-line drive circuit 804, a data-line drive circuit 805, a driver IC 806, and a photo detection circuit 807. The driver IC 806 functions as a control unit which provides a signal to the scanning-line drive circuit 804 and the data-line drive circuit 805. The data-line drive circuit 805 may be included in the driver IC 806. Also, the data-line drive circuit 805 may be incorporated in the driver IC 806. The driver IC 806 may be arranged on the substrate 801 separately in a form of an IC chip or the like, or may be provided in a flexible printed circuit (FPC) for external installment.

The photo detection circuit 807 includes the above-described photosensor according to the present invention. The photo detection circuit 807 may be the photo detection circuit 400 described with reference to FIG. 4 or the photo detection circuit 500 described with reference to FIG. 5. The photosensor included in the photo detection circuit 807 may be any of the above-described photosensors 100, 200, and 300. Also, in the organic electroluminescence display device 800, a plurality of photo detection circuits 807 may be provided. The photo detection circuit 807 outputs a signal in accordance with external light illuminance to the driver IC 806. The driver IC 806 may correct a signal to be provided to the data-line drive circuit 805 based on the signal received from the photo detection circuit 807. Note that correction of a data signal based on the signal received from the photo detection circuit 807 may be performed in the data-line drive circuit 805.

In the display region 802 shown in FIG. 8, a plurality of pixels are arranged in a matrix. Each matrix is provided with a data signal in accordance with image data from the data-line drive circuit 805. The data signal has been corrected based on the signal output from the photo detection circuit 807. A transistor provided in each pixel is driven, and image display can be made in accordance with external light illuminance based on the data signal. A thin-film transistor (TFT) can be typically used as the transistor. However, not only the thin-film transistor but also any element may be used as long as an element has a current control function. Also, the thin-film transistor may be of an N-channel type or a P-channel type. In the present embodiment, the thin-film transistor for use in the display region 802 is assumed to be of an N-channel type.

Figure 9:
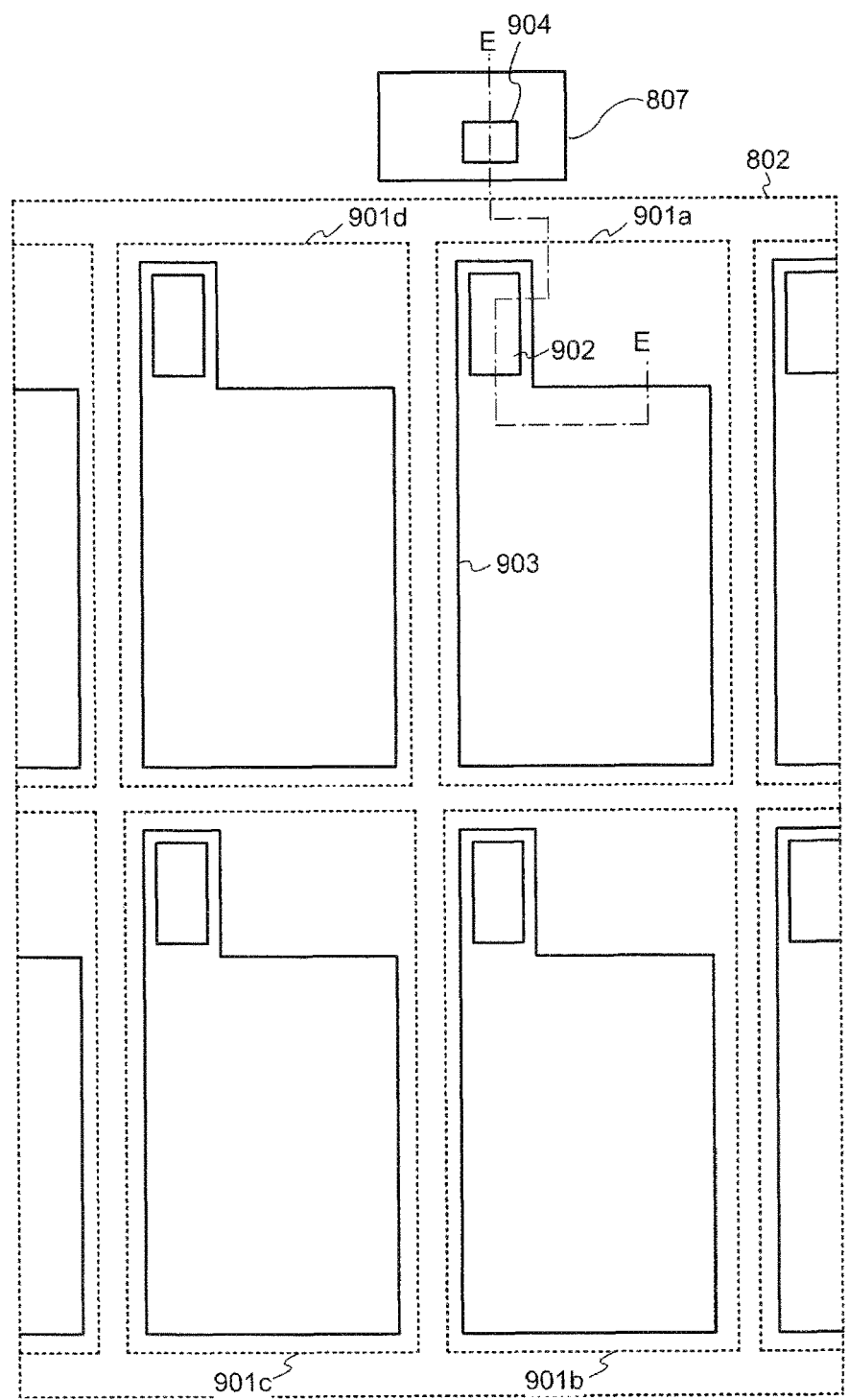
FIG. 9 is a diagram showing the structure of a display region in the organic electroluminescence display device.

FIG. 9 is a diagram showing the structure of the display region 802 of the organic electroluminescence display device 800. Specifically, as a part of the display region 802, a structure is shown in which four pixels 901a, 901b, 901c, and 901d are viewed from the planar direction. While four pixels are shown in FIG. 9, several millions of pixels or more are actually arranged in a matrix. Also, the structure inside each pixel is not restricted to the structure shown in FIG. 9. Note that, by way of example, the photo detection circuit 807 having a photosensor 904 is arranged adjacently to the pixel 901a. The photosensor 904 may be any of the above-described photosensors 100, 200, and 300. In the following, by way of example, description is made by assuming that the photosensor 904 has a structure substantially identical to that of the photosensor 100 described with reference to FIG. 1A and FIG. 1B.

The pixels 901a, 901b, 901c, and 902d each have a thin-film transistor 902 therein. As will be described further below, the thin-film transistor 902 functions as a current control element which supplies appropriate current to a light-emitting element. That is, a pixel electrode 903 is electrically connected to the source electrode or the drain electrode of the thin-film transistor 902 and a light-emitting element with a pixel electrode taken as an anode is supplied with current. Although description is omitted herein, a thin-film transistor which functions as a switching element may be provided inside the pixel 901 and a pixel may be include a plurality of transistors. While the example has been described in which pixels are in a stripe array as a pixel array, the pixels may be in a delta array, a Bayer array, an array for achieving a PenTile structure, or the like.

Figure 10:
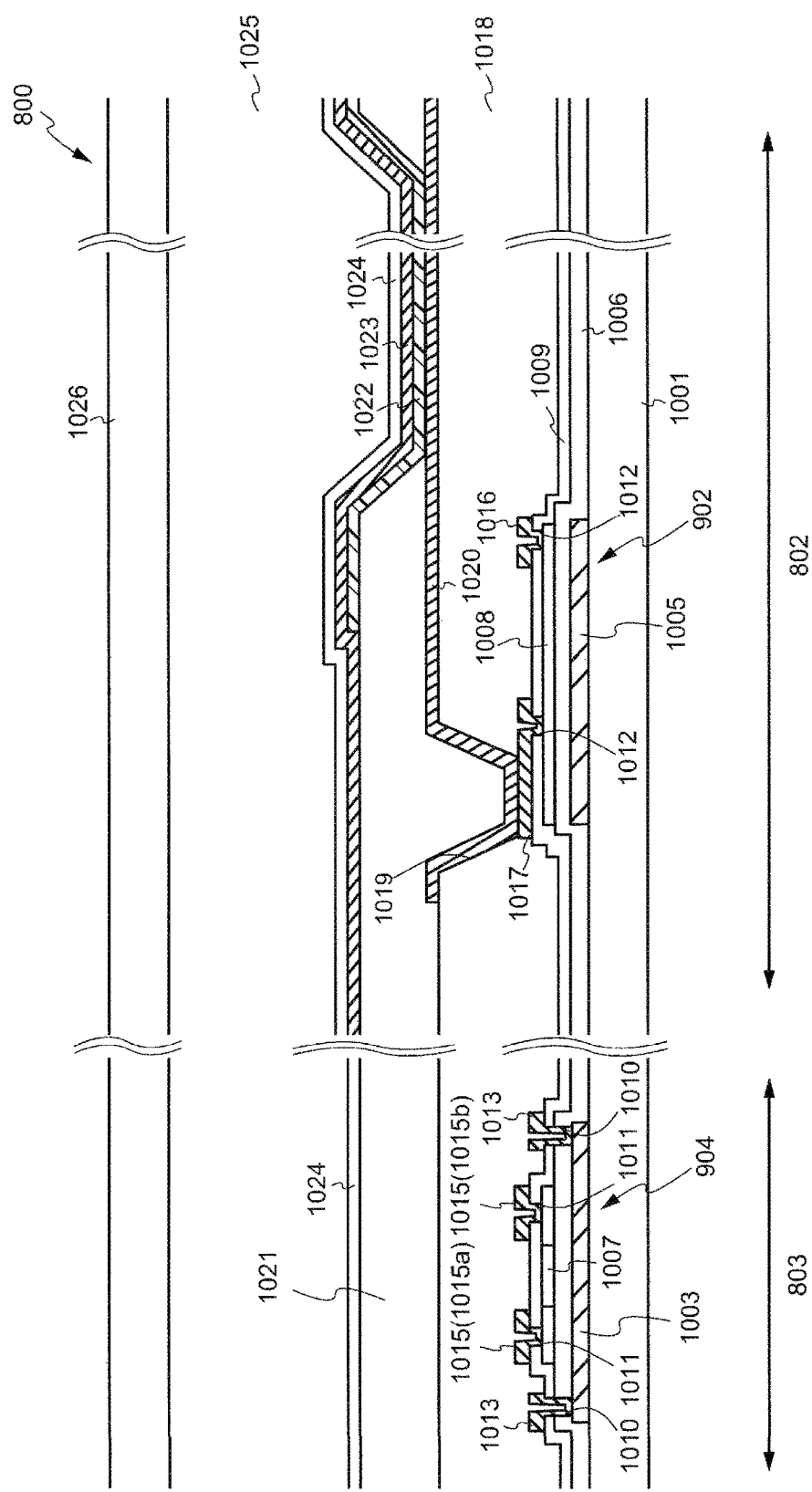
FIG. 10 is a diagram showing the structure of a pixel in the organic electroluminescence display device.

FIG. 10 is a diagram showing the structure of a pixel in the organic electroluminescence display device 800. Specifically, FIG. 10 is a diagram showing the structure of a section obtained by cutting the pixel 901a and the photosensor 904 of the photo detection circuit 807 along an E-E line shown in FIG. 9.

In FIG. 10, a first light-shielding layer 1003 of the photosensor 904 is provided in the peripheral region 803 on an insulating substrate 1001. Also, a gate electrode 1005 of the thin-film transistor 902 is provided in the display region 802 on the insulating substrate 1001. The first light-shielding layer 1003 of the photosensor 904 and the gate electrode 1005 of the thin-film transistor 902 are provided to the same layer, and can be formed in the same process and by using the same metal material. As the insulating substrate 1001, a glass substrate, a quartz substrate, a ceramics substrate, or any of flexible substrates (bendable substrates such as those made of polyimide, polyethylene terephthalate, and polyethylene naphthalate) can be used.

A first insulating layer 1006 which covers the first light-shielding layer 1003 and the gate electrode 1005 is provided on the insulating substrate 1001. As the first insulating layer 1006, silicon nitride, nitrided silicon oxide, oxidized silicon nitride, or the like can be used.

In the peripheral region 803, a semiconductor layer 1007 of the photosensor 904 is provided on the first insulating layer 1006. The semiconductor layer 1007 includes a P-type impurity region, an N-type impurity region, and an intrinsic region provided between the P-type impurity region and the N-type impurity region. Also, in the display region 802, a semiconductor layer 1008 of the thin-film transistor 902 is provided on the first insulating layer 1006. Here, the thin-film transistor 902 has a structure of a bottom gate type. However, the structure of the thin-film transistor 902 is not restricted to be of a bottom gate type, but may be of a top gate type. The semiconductor layer 1007 of the photosensor 904 and the semiconductor layer 1008 of the thin-film transistor 902 are provided to the same layer, and can be formed in the same process and by using, for example, low-temperature polysilicon.

A second insulating layer 1009 which covers the semiconductor layer 1007 of the photosensor 904 and the semiconductor layer 1008 of the thin-film transistor 902 is provided on the semiconductor layer 1007 and on the semiconductor layer 1008. As the second insulating layer 1009, silicon nitride, nitrided silicon oxide, oxidized silicon nitride, or the like can be used.

In the peripheral region 803, the second insulating layer 1009 is provided with an opening 1010 reaching at least the first insulating layer 1006. The opening 1010 is provided so as to surround the semiconductor layer 1007 as viewed from the planar direction. As shown in FIG. 10, the opening 1010 is provided in the second insulating layer 1009 and the first insulating layer 1006, and a bottom part of the opening 1010 makes contact with the first light-shielding layer 1003. Also in the peripheral region 803, openings 1011 which expose the semiconductor layer 1007 are provided in the second insulating layer 1009. The openings 1011 expose the P-type impurity region and the N-type impurity region of the semiconductor layer 1007.

In the display region 802, openings 1012 which expose the semiconductor layer 1008 are provided in the second insulating layer 1009. The openings 1012 expose a P-type impurity region and an N-type impurity region of the semiconductor layer 1008.

In the peripheral region 803, a second light-shielding layer 1013 which covers at least a side wall of the opening 1010 is provided. The second light-shielding layer 1013 may be, for example, a metal layer. Also in the peripheral region 803, an electrode layer 1015 which covers at least a side wall of the opening 1011 is provided. The electrode layer 1015 includes a first electrode 1015a and a second electrode 1015b electrically connected to the P-type impurity region and the N-type impurity region of the semiconductor layer 1007, respectively. In FIG. 10, the electrode layer 1015 is provided to the same layer as the second light-shielding layer 1013.

In the display region 802, an electrode layer 1016 and an electrode layer 1017 which cover at least a side wall of each of the openings 1012 are provided. The electrode layers 1016 and 1017 each may be a drain electrode or source electrode of the thin-film transistor 902.

A planarizing layer 1018 is provided on the second light-shielding layer 1013 and the electrode layers 1015, 1016, and 1017. As the planarizing layer 1018, for example, epoxy resin, acrylic resin, and high-polymer materials such as polyimide, polyamide, polycarbonate, and polysiloxane can be used. These materials allow film formation by solution coating, and have a high planarizing effect.

The planarizing layer 1018 includes a contact hole 1019 which exposes a part of the source electrode or drain electrode 1017 of the thin-film transistor 902 (that is, overlaps a part of the source electrode or drain electrode 1017). The contact hole 1019 is an opening for electrically connecting a pixel electrode 1020, which will be described further below, and the source electrode or drain electrode 1017.

The pixel electrode 1020 is provided so as to be electrically connected to the source electrode or drain electrode 1017. In the organic electroluminescence display device 800, the pixel electrode 1020 functions as an anode configuring an organic electroluminescence display element. The pixel electrode 1020 has a different structure based on whether the pixel electrode 1020 is of a top emission type or bottom emission type. For example, in the case of a top emission type, a metal film with high reflectivity or a laminated structure of the metal film and a transparent conductive film with a high work function such as an indium-oxide-based transparent conductive film (for example, ITO) or a zinc-oxide-based transparent conductive film (for example, IZO or ZnO) can be used as the pixel electrode 1020. On the other hand, in the case of a bottom emission type, the above-described transparent conductive film can be used as the pixel electrode 1020. Here, an organic electroluminescence display device of a top emission type is described as an example.

Between adjacent pixel electrodes 1020, a bank 1021 configured of a resin material is provided. The bank 1021 includes an opening in a portion which serves as a pixel's light-emitting region. That is, the bank 1021 is provided so as to cover the thin-film transistor 902 and an edge part of the pixel electrode 1020. In this manner, the bank 1021 functions as a member which partitions the respective pixels. The opening of the bank 1021 has an inner wall preferably in a tapered shape. With this, at the time of forming a light-emitting layer, which will be described further below, a coverage defect at an end of the pixel electrode 1020 can be reduced.

The bank 1021 not only covers the end of the pixel electrode 1020 but also may function as a filler for filling a recess due to the contact hole 1019 provided in the planarizing layer 1018. As the bank 1021, known resin materials can be used, such as polyimide-based, polyamide-based, acryl-based, epoxy-based, or siloxane-based resin materials. Also, when this bank 1021 is formed, a lens may be formed to the planarizing layer 1018 by using the same resin material as that of the bank 1021 so as to overlap the semiconductor layer 107 as viewed from the planar direction in the peripheral region 803.

An electroluminescence layer (EL layer) 1022 is provided on the pixel electrode 1020 and the bank 1021. The EL layer 1022 includes a light-emitting layer comprising at least an organic material, and functions as a light-emitting part of the organic electroluminescence element. The EL layer 1022 may include, in addition to the light-emitting layer, various charge transport layers such as an electron injection layer, an electron transport layer, a hole injection layer, and a hole transport layer. As the EL layer 1022, a known structure and a known material can be used, and the EL layer 1022 is not particularly restricted by the structure of the present embodiment.

A common electrode 1023 which functions as a cathode of the organic electroluminescence element is provided on the EL layer 1022. Since the organic electroluminescence display device 800 of the present embodiment is of a top emission type, a transparent electrode is used as the common electrode 1023. As a thin film configuring the transparent electrode, a MgAg thin film or transparent conductive film (such as ITO or IZO) is used. The common electrode 1023 is provided to an entire surface of the display region 802 across the respective pixels. Also, in the peripheral region 803 near an end of the display region 802, the common electrode 1023 is electrically connected to an external terminal via a lower conductive layer. When the common electrode 1023 is formed as a transparent electrode, the common electrode 1023 may extend to a region overlapping the photosensor 904 in the peripheral region 803.

In the present embodiment, the pixel electrode 1020, the EL layer 1022, and the common electrode 1023 configure the organic electroluminescence element. Furthermore, to protect the organic electroluminescence element from outside moisture and so forth, a third insulating layer 1024 configured of an inorganic material may be provided. As the third insulating layer 1024, an inorganic insulating film with high tightness such as a silicon nitride film is preferably used.

The above-described components from the insulating substrate 1001 to the third insulating layer 1024 are collectively referred to as an array substrate in the present embodiment.

Above the array substrate, an opposing substrate 1026 is provided via a filler (filling material) 1025 functioning as an adhesive or protective material. As the filler 1025, known resin materials can be used, such as polyimide-based, polyamide-based, acryl-based, epoxy-based, or siloxane-based resin materials. The filler 1025 may be provided with a spacer for ensuring a gap between the array substrate and the opposing substrate. This spacer may be mixed in the filler, or may be formed of resin or the like on the array substrate. Also, if sufficient sealing at a periphery portion of the substrates and retaining a gap between the array substrate and the opposing substrate can be achieved, hollow sealing can be made without using the filler 1025.

When the EL layer 1022 emits white light, the opposing substrate 1026 may be provided with color filters corresponding to respective colors of RGB on a main surface (a surface facing the insulating substrate 1001) and black masks between the color filters. However, the structure of the opposing substrate 1026 is not restricted to this. The opposing substrate 1026 may be provided with, for example, an overcoat layer for planarization. The opposing substrate 1026 is not an essential component for the organic electroluminescence display device 800, and can be omitted when color filters are omitted and the EL layer 315 is provided for each pixel and for each of the colors of RGBW. Furthermore, the opposing substrate 1026 can be omitted if the color filters are formed on an insulating substrate 1001 side.

In the above-structured organic electroluminescence device 800 of the present embodiment, the photosensor 904 is provided with the first light-shielding layer 1003 below the semiconductor layer 1007, and the second light-shielding layer 1013 is provided so as to surround the semiconductor layer 1007 as viewed from the planar direction. The first light-shielding layer 1003 and the second light-shielding layer 1013 shield light so as to prevent light emitted from the EL layer 1022 including the light-emitting layer from entering the semiconductor layer 1007 from a lateral direction. That is, the first light-shielding layer 1003 and the second light-shielding layer 1013 shield light so as to prevent light transmitted through the first insulating layer 1006 and the second insulating layer 1009 from entering the semiconductor layer 1007. In other words, the first light-shielding layer 1003 and the second light-shielding layer 1013 prevent light other than external light from entering the semiconductor layer 1007. Thus, detection accuracy of external light illuminance of the photosensor 100 can be improved.

Also, in the organic electroluminescence device 800, the semiconductor layer 1007 of the photosensor 904 and the semiconductor layer 1008 of the thin-film transistor 902 are provided to the same layer on the insulating substrate 100. Thus, the semiconductor layer 1007 and the semiconductor layer 1008 can be formed in the same process. Furthermore, the gate electrode 1005 of the thin-film transistor 902 is provided to the same layer as the first light-shielding layer 1003 of the photosensor 904, and the source electrode and the drain electrode, 1016 and 1017, of the thin-film transistor 902 are provided to the same layer as the second light-shielding layer 1013 of the photosensor 904. Thus, the gate electrode 1005 of the thin-film transistor 902 can be formed in the same process as that of the first light-shielding layer 1003 of the photosensor 904, and the source electrode and the drain electrode, 1016 and 1017, of the thin-film transistor 902 can be formed in the same process as that of the second light-shielding layer 1013 of the photosensor 904.

In the present embodiment, the example has been described in which the gate electrode 1005 of the thin-film transistor 902 is provided to the same layer as the first light-shielding layer 1003 of the photosensor 904 and the source electrode and the drain electrode, 1016 and 1017, of the thin-film transistor 902 are provided to the same layer as the second light-shielding layer 1013 of the photosensor 904. However, the present invention is not restricted to this structure. For example, either one of the source electrode and the drain electrode, 1016 and 1017, of the thin-film transistor 902 may be provided to the same layer as the second light-shielding layer 1013 of the photosensor 904. Also, for example, when the structure of the thin-film transistor 902 is of a top gate type, the gate electrode of the thin-film transistor may be provided to the same layer as the second light-shielding layer of the photosensor.

In the present embodiment, the example has been described in which the photo detection circuit having the photosensor according to the present invention is implemented in the organic electroluminescence display device. However, the photosensor according to the present invention may be applied to another display device other than the organic electroluminescence display device.

Based on the photosensor and the display device described as the embodiments of the present invention, those subjected to addition, deletion, or design change of a component as appropriate by a person skilled in the art or those subjected to addition, omission, or conditional change of a process are also included in the scope of the present invention as long as these include the gist of the present invention. Furthermore, the above-described embodiments can be mutually combined in a range not causing a technical inconsistency.

Still further, even functions and effects which are different from functions and effects brought by the modes of the embodiments described above and are evident from the description of the specification or easily predictable by the person skilled in the art are interpreted as being naturally brought by the present invention.

What is claimed is:
1. A photosensor comprising:
a first light-shielding layer provided on an insulating surface;

a first insulating layer covering the first light-shielding layer;

a semiconductor layer provided on the first insulating layer, the semiconductor layer being connected to a first electrode and a second electrode, and the semiconductor layer configuring a diode;

a second insulating layer covering the semiconductor layer;

an opening provided in the second insulating layer so as to surround the semiconductor layer as viewed from a planar direction and the opening reaching at least the first insulating layer; and a second light-shielding layer covering at least a side wall of the opening, wherein the opening is provided in the second insulating layer and the first insulating layer to reach the first light-shielding layer, and the second light-shielding layer covers at least the side wall of the opening and makes contact with the first light-shielding layer.

2. The photosensor according to claim 1, wherein the second light-shielding layer has a lower surface in the opening as viewed from a cross-sectional direction closer to the insulating surface rather than a lower surface of the semiconductor layer.

3. The photosensor according to claim 1, wherein the first electrode and the second electrode are provided to a layer that is the same as the second light-shielding layer.

4. The photosensor according to claim 1, wherein the semiconductor layer includes a P-type impurity region in contact with the first electrode, an N-type impurity region in contact with the second electrode, and an intrinsic region interposed between the P-type impurity region and the N-type impurity region.

5. The photosensor according to claim 4, wherein the first light-shielding layer is applied with a control potential having a potential difference with respect to the P-type impurity region or the N-type impurity region.

6. The photosensor according to claim 1, further comprising:

a planarizing layer provided on the second light-shielding layer; and a lens provided on the planarizing layer, wherein the lens and the semiconductor layer overlap each other in a planar view.

7. The photosensor according to claim 1, wherein each of the first light-shielding layer and the second light-shielding layer is a metal layer.

8. A display device comprising:
a photosensor;
a transistor;
a planarizing layer; and
a light-emitting element, wherein
the photosensor comprises:
 a first light-shielding layer provided on an insulating surface;
 a first insulating layer covering the first light-shielding layer;
 a semiconductor layer provided on the first insulating layer, the semiconductor layer being connected to a first electrode and a second electrode, and the semiconductor layer configuring a diode;
 a second insulating layer covering the semiconductor layer;
 an opening provided in the second insulating layer so as to surround the semiconductor layer as viewed from a planar direction and the opening reaching at least the first insulating layer; and
 a second light-shielding layer filling the opening,
the transistor comprises another semiconductor layer that is the same as the semiconductor layer,
the light-emitting element is provided on the planarizing layer and electrically connected to the transistor,
the planarizing layer is provided on the second light-shielding layer, and
at least one of a gate electrode, a source electrode, or a drain electrode of the transistor is provided to a layer that is the same as the first light-shieling layer or the second light-shielding layer.

9. The display device according to claim 8, further comprising:

a bank provided on the planarizing layer, and the bank partitioning the light-emitting element; and a lens provided on the planarizing layer and overlapping the semiconductor layer of the photosensor as viewed from the planar direction, wherein the bank and the lens are formed of a same material.

10. The display device according to claim 8, wherein the first electrode and the second electrode are provided to the same layer as the second light-shielding layer.

11. The display device according to claim 8, wherein the semiconductor layer includes a P-type impurity region in contact with the first electrode, an N-type impurity region in contact with the second electrode, and an intrinsic region interposed between the P-type impurity region and the N-type impurity region.

12. A photo detection circuit comprising:
a photosensor;
a transistor; and
a capacitor, wherein
the photosensor comprises:
 a first light-shielding layer provided on a first insulating surface;
 a first insulating layer covering the first light-shielding layer;
 a first semiconductor layer provided on the first insulating layer;
 the first semiconductor layer being connected to a first electrode and a second electrode, the first semiconductor layer configuring a first diode,
 a second insulating layer covering the first semiconductor layer;
 a first opening provided in the second insulating layer so as to surround the first semiconductor layer as viewed from a planar direction and the first opening reaching at least the first insulating layer; and
 a second light-shielding layer covering at least a side wall of the first opening,
the transistor has an end connected to a node electrically connected to the first electrode or the second electrode, another end connected to a first ground, and a gate electrode connected to a reset signal line,
the gate electrode is configured to be applied with a reset signal via the reset signal line, and
the capacitor is connected between the node and the first ground and is connected in series to the photosensor via the node.

13. The photo detection circuit according to claim 12, wherein
the first semiconductor layer includes a P-type impurity region in contact with the first electrode, an N-type impurity region in contact with the second electrode, and an intrinsic region interposed between the P-type impurity region and the N-type impurity region.

14. The photo detection circuit according to claim 13, wherein
each of the first light-shielding layer and the second light-shielding layer is a metal layer.

15. The photo detection circuit according to claim 14, wherein
the first light-shielding layer is applied with a control potential having a potential difference with respect to the P-type impurity region or the N-type impurity region.

16. The photo detection circuit according to claim 12, further comprising a heat sensor, wherein
the heat sensor comprises:
a third light-shielding layer provided on a second insulating surface;
a third insulating layer covering the third light-shielding layer;
a second semiconductor layer provided on the third insulating layer, the second semiconductor layer being connected to a third electrode and a fourth electrode, and the second semiconductor layer configuring a second diode;
a fourth insulating layer covering the second semiconductor layer;
a second opening provided in the fourth insulating layer so as to surround the second semiconductor layer as viewed from the planar direction and the second opening reaching at least the third insulating layer;
a fourth light-shielding layer covering at least a side wall of the second opening; and
a light-shielding film overlapping above the second semiconductor layer,
wherein the heat sensor is connected between the node and a second ground and connected in series to the photosensor via the node.

* * * * *